(12) United States Patent
Bhat et al.

(10) Patent No.: US 7,759,717 B2
(45) Date of Patent: Jul. 20, 2010

(54) CAPACITORS COMPRISING DIELECTRIC REGIONS HAVING FIRST AND SECOND OXIDE MATERIAL PORTIONS OF THE SAME CHEMICAL COMPOSITON BUT DIFFERENT DENSITIES

(75) Inventors: Vishwanath Bhat, Boise, ID (US); Chris M. Carlson, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/364,383

(22) Filed: Feb. 27, 2006

(65) Prior Publication Data

US 2006/0145294 A1 Jul. 6, 2006

Related U.S. Application Data

(60) Continuation of application No. 10/914,824, filed on Aug. 9, 2004, now Pat. No. 7,056,784, which is a division of application No. 10/636,035, filed on Aug. 6, 2003, now Pat. No. 6,855,594.

(51) Int. Cl.
*H01L 29/76* (2006.01)
(52) U.S. Cl. ............... 257/306; 257/532; 257/E27.048
(58) Field of Classification Search ............... 257/306, 257/532, E27.048, E21.01
See application file for complete search history.

(56) References Cited

U.S. PATENT DOCUMENTS

| | | | |
|---|---|---|---|
| 5,195,018 A * | 3/1993 | Kwon et al. ............... 361/313 |
| 5,719,417 A | 2/1998 | Roeder et al. | |
| 5,783,253 A | 7/1998 | Roh | |
| 6,207,522 B1 * | 3/2001 | Hunt et al. ............... 438/393 |
| 6,218,233 B1 | 4/2001 | Takemura | |
| 6,245,606 B1 | 6/2001 | Wilk et al. | |
| 6,265,259 B1 | 7/2001 | Wu | |
| 6,342,445 B1 | 1/2002 | Marsh | |
| 6,355,519 B1 | 3/2002 | Lee | |
| 6,358,789 B2 | 3/2002 | Lee | |
| 6,469,333 B1 | 10/2002 | Takai et al. | |
| 6,576,509 B1 * | 6/2003 | Toyokawa et al. ......... 438/253 |
| 6,743,475 B2 | 6/2004 | Skarp et al. | |
| 6,777,776 B2 * | 8/2004 | Hieda .................... 257/532 |
| 6,818,553 B1 * | 11/2004 | Yu et al. ................. 438/648 |
| 7,144,771 B2 * | 12/2006 | Nam et al. .............. 438/244 |
| 2001/0014482 A1 * | 8/2001 | Agarwal et al. ............ 438/2 |
| 2002/0006700 A1 * | 1/2002 | Kanamori et al. ......... 438/253 |
| 2002/0086556 A1 | 7/2002 | Ahn et al. | |
| 2002/0135048 A1 | 9/2002 | Ahn et al. | |
| 2004/0075130 A1 * | 4/2004 | Nam et al. .............. 257/306 |
| 2004/0166627 A1 | 8/2004 | Lim et al. | |
| 2004/0180493 A1 | 9/2004 | Chung et al. | |

(Continued)

*Primary Examiner*—Tuan N. Quach
(74) *Attorney, Agent, or Firm*—Wells St. John P.S.

(57) ABSTRACT

A capacitor includes a first capacitor electrode which includes conductive metal. A second capacitor electrode is spaced from the first capacitor electrode. A capacitor dielectric region is received between the first and second capacitor electrodes. Such region comprising a first portion oxide material of a first density over the first capacitor electrode, and a second portion oxide material of a second density received over the first portion. The oxide-comprising material of the first portion and the oxide-comprising material of the second portion are the same in chemical composition and the second density is greater than the first density.

29 Claims, 4 Drawing Sheets

U.S. PATENT DOCUMENTS

2004/0211995 A1 10/2004 Park et al.
2005/0042859 A1* 2/2005 Yu et al. .................... 438/636
2007/0241390 A1* 10/2007 Tanaka et al. ............... 257/314

* cited by examiner

US 7,759,717 B2

CAPACITORS COMPRISING DIELECTRIC REGIONS HAVING FIRST AND SECOND OXIDE MATERIAL PORTIONS OF THE SAME CHEMICAL COMPOSITON BUT DIFFERENT DENSITIES

RELATED PATENT DATA

This patent resulted from a continuation application of U.S. patent application Ser. No. 10/914,824, filed Aug. 9, 2004, U.S. Pat. No. 7,056,784, entitled "Methods of Forming Capacitors", naming Vishwanath Bhat, Chris M. Carlson and F. Daniel Gealy as inventors, the disclosure of which is incorporated by reference; which resulted from a divisional application of U.S. patent application Ser. No. 10/636,035, filed Aug. 6, 2003, entitled "Methods of Forming Capacitors", naming Vishwanath Bhat, Chris M. Carlson and F. Daniel Gealy as inventors, now U.S. Pat. No. 6,855,594 B1, the disclosure of which is incorporated by reference.

TECHNICAL FIELD

The invention is related to methods of forming capacitors.

BACKGROUND OF THE INVENTION

A continuing goal in integrated circuitry fabrication is to form the circuitry components to be smaller and denser over a given area of a semiconductor substrate. One common circuit device is a capacitor, which has a capacitor dielectric region received between a pair of conductive electrodes. In such devices, there is a continuous challenge to maintain sufficiently high storage capacitance despite decreasing area in the denser circuits. Additionally, there is a continuing goal to further decrease cell area. One manner of increasing cell capacitance is through cell structure techniques. Such techniques include three-dimensional cell capacitors, such as trench or stacked capacitors.

Highly integrated memory devices, for example 256 Mbit DRAMs and beyond, are expected to require a very thin dielectric film for the three-dimensional capacitors of cylindrically stacked, trenched or other structures. To meet this requirement, the capacitor dielectric film thickness will be below 2.5 nanometer of $SiO_2$ equivalent thickness. Accordingly, materials other than $SiO_2$ having higher dielectric constants are expected to be used. $Si_3N_4$ is one such material which has been used either alone or in combination with silicon dioxide as a capacitor dielectric region. Insulating inorganic metal oxide materials, for example $Al_2O_3$, $Ta_2O_5$ and barium strontium titanate, have even higher dielectric constants and low leakage currents which make them attractive as capacitor dielectric materials for high density DRAMs, non-volatile memories and other integrated circuitry.

In many of such applications, it will be highly desirable to utilize metal for the capacitor electrodes, thus forming a metal-insulator-metal (MIM) capacitor. In the context of this document, a "metal" encompasses elemental metals, alloys of elemental metals, and metal compounds regardless of stoichiometry. Exemplary conductive metals proposed for use with $Al_2O_3$ as the capacitor dielectric material include titanium nitride, tungsten nitride and tantalum nitride. Unfortunately, these materials can be appreciably oxidized when exposed to the typical chemical vapor deposition or atomic layer deposition (ALD) techniques under which $Al_2O_3$ (or other dielectric materials) would be deposited. The oxides which form typically have a reduced dielectric constant or increased leakage than $Al_2O_3$, thereby having an adverse effect on the capacitor being fabricated. It would be desirable to at least reduce the degree of oxidation of a metal capacitor electrode layer during the formation of an oxide dielectric thereover.

While the invention was motivated from this perspective, it is in no way so limited. The invention is only limited by the accompanying claims, appropriately interpreted in accordance with the doctrine of equivalents, without limiting reference to the specification, and with the specification herein only providing but exemplary preferred embodiments.

SUMMARY OF THE INVENTION

The invention includes methods of forming capacitors. In one implementation, a method of forming a capacitor includes forming a conductive metal first electrode layer over a substrate, with the conductive metal being oxidizable to a higher degree at and above an oxidation temperature as compared to any degree of oxidation below the oxidation temperature. At least one oxygen containing vapor precursor is fed to the conductive metal first electrode layer below the oxidation temperature under conditions effective to form a first portion oxide material of a capacitor dielectric region over the conductive metal first electrode layer. At least one vapor precursor is fed over the first portion at a temperature above the oxidation temperature effective to form a second portion oxide material of the capacitor dielectric region over the first portion. The oxide material of the first portion and the oxide material of the second portion are common in chemical composition. However, the oxide of the second material might be of higher density and have superior electrical properties as compared to the first portion of the oxide material. A conductive second electrode layer is formed over the second portion oxide material of the capacitor dielectric region.

In one implementation, a method of forming a capacitor includes forming a conductive metal first electrode layer over a substrate, with the conductive metal first electrode layer being oxidizable to a higher degree at and above an oxidation temperature as compared to any degree of oxidation below the oxidation temperature. A capacitor dielectric region is formed over the conductive metal first electrode layer by atomic layer deposition. The atomic layer deposition comprises forming a first portion of the capacitor dielectric region at a temperature below the oxidation temperature, and forming a second portion of the capacitor dielectric region over the first portion at a temperature above the oxidation temperature. The first portion restricts oxidation of the conductive metal first electrode layer during formation of the second portion. A conductive second electrode layer is formed over the second portion of the capacitor dielectric region.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
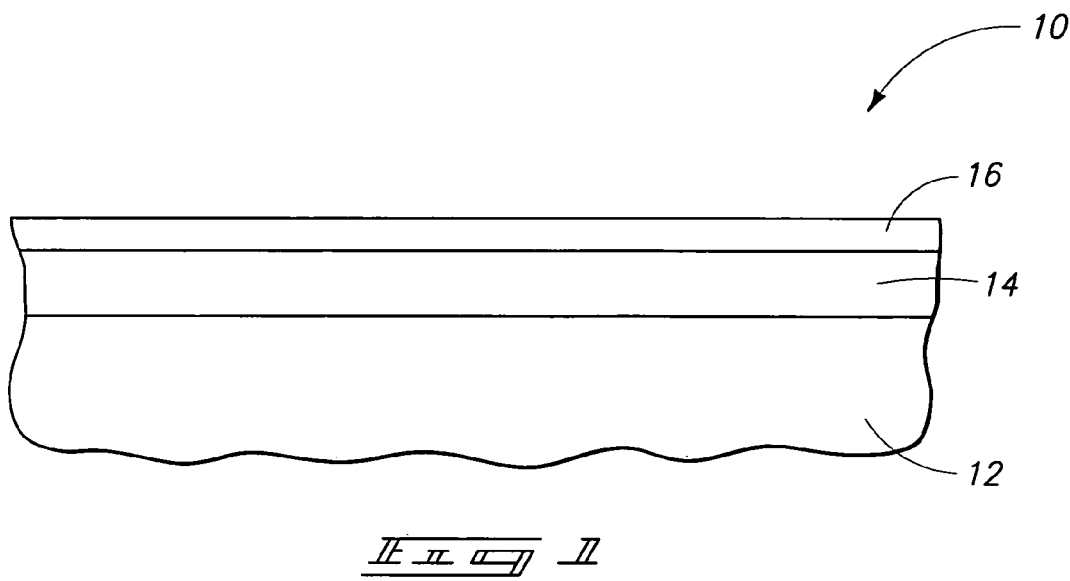
FIG. 1 is a diagrammatic sectional view of a semiconductor wafer fragment in process in accordance with an aspect of the invention.

The invention is described in a first preferred embodiment in connection with FIGS. 1-4. FIG. 1 depicts a semiconductor substrate 10 comprising bulk monocrystalline silicon material 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural, unless otherwise indicated.

An insulative layer 14, for example silicon dioxide, is formed over substrate material 12. By way of example only, such depicts a substrate over which a capacitor will be fabricated. Any conceivable substrate is contemplated, whether existing or yet-to-be developed. A conductive metal first electrode layer 16 is formed over substrate 12/14. Such material is oxidizable at and above some oxidation temperature in the presence of an oxygen containing material to a higher degree at and above such temperature as compared to any degree of oxidation below such temperature. The oxidation temperature referred to is not necessarily the minimum temperature at which the material will oxidize in the presence of the oxygen containing material, for example as conditions in addition to temperature can effect whether a given material will oxidize. Rather, the stated oxidation temperature can be any temperature at which the material can oxidize in the presence of the oxygen containing material. Exemplary conductive metals include metal nitrides such as titanium nitride, tungsten nitride and tantalum nitride. These materials appreciably oxidize in the presence of many oxygen containing materials at an exemplary oxidation temperature of 300° C. and above. Electrode layer 16 might be formed by any existing or yet-to-be developed method, for example by sputtering, chemical vapor deposition and/or atomic layer deposition.

Figure 2:
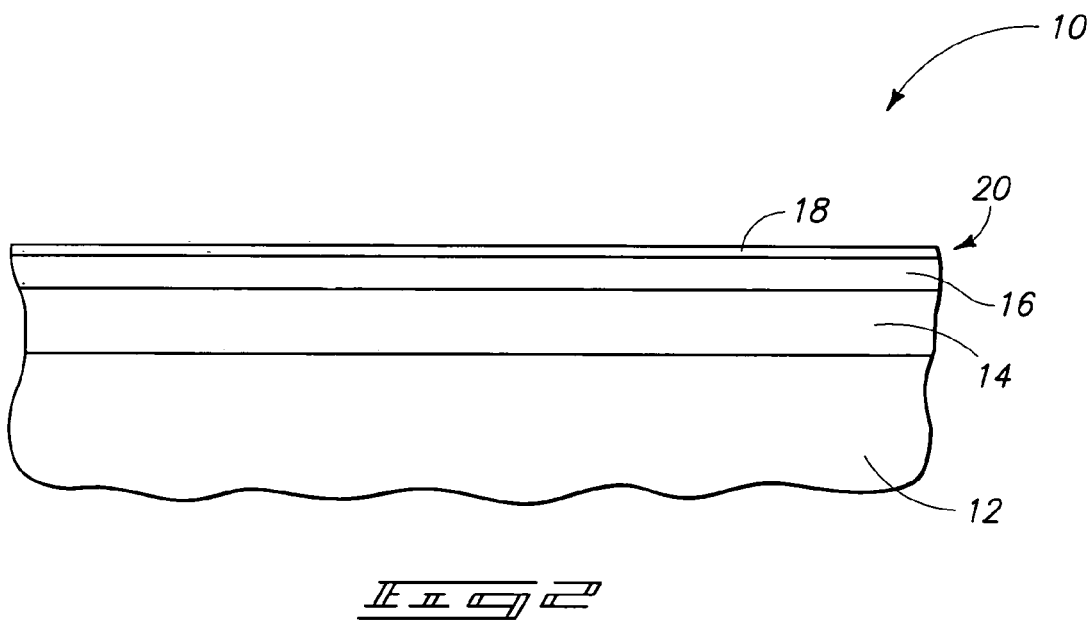
FIG. 2 is a view of the FIG. 1 wafer fragment at a processing step subsequent to that shown by FIG. 1.

Referring to FIG. 2, at least one oxygen containing vapor precursor is fed to conductive first metal electrode layer 16 below the selected oxidation temperature under conditions effective to form a first portion oxide material 18 over conductive metal first electrode layer 16. Accordingly with the above exemplary materials, an exemplary preferred oxidation temperature below which the at least one vapor precursor is flowed is 300° C., by way of example only 290° C. First portion 18 will comprise a portion of a capacitor dielectric region 20, as will be apparent from the continuing discussion. By way of example only, an exemplary preferred material is aluminum oxide. Also as shown, first portion 18 is preferably formed "on" (meaning in direct physical contact with) conductive metal first electrode layer 16. Most preferably, first portion oxide material 18 is formed without any measurable oxidation occurring of metal first electrode layer 16, although some oxidation thereof is not precluded in the broadest considered aspects of the invention, as claimed. By way of example only, the conditions might include chemical vapor deposition (for example feeding multiple vapor precursors simultaneously to the substrate), atomic layer deposition, yet-to-be developed methods and/or any combination thereof. For example with respect to atomic layer deposition, the conditions might include previous formation of a monolayer to which one or more multiple oxygen containing precursor feeds occur.

Figure 3:
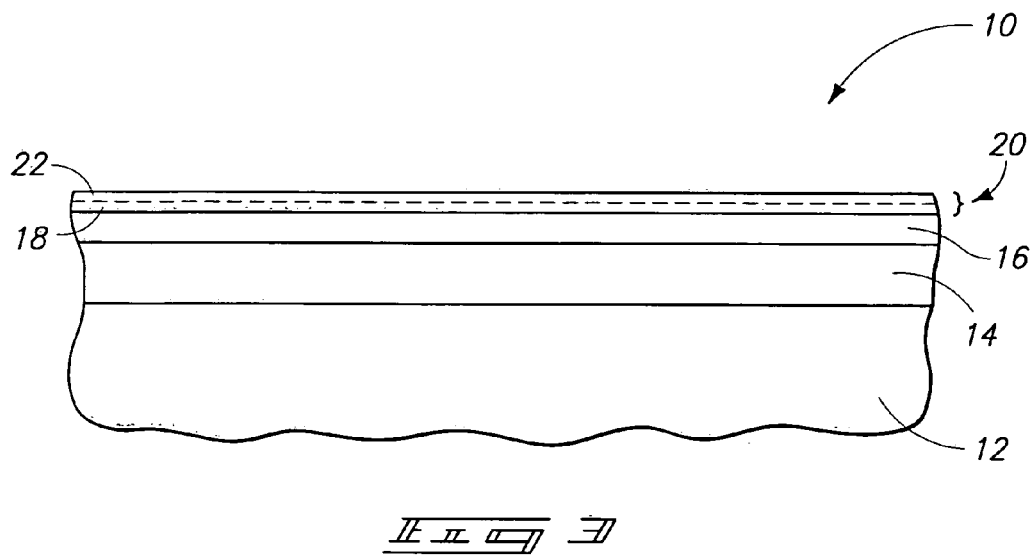
FIG. 3 is a view of the FIG. 2 wafer fragment at a processing step subsequent to that shown by FIG. 2.

Referring to FIG. 3, at least one vapor precursor is fed over first portion 18 at a temperature above the oxidation temperature effective to form a second portion oxide material 22 of capacitor dielectric region 20 over first portion 18. In one preferred embodiment, the precursor flowing during the formation of the second portion oxide material is at a temperature which is at least 25° C. higher than during the formation of the first portion oxide material, in another preferred embodiment at a temperature which is at least 50° C. higher, and in yet another preferred embodiment at a temperature which is at least 100° C. higher. Regardless, the oxide material of first portion 18 and second portion 22 are of the same/common chemical composition. However, the oxide of the second material might be of higher density and have superior electrical properties as compared to the first portion of the oxide material. The vapor precursor(s) used to form portion 22 might be the same or different from that/those used to form portion 18. Preferably and as shown, second portion 22 is formed on first portion 18. Preferably, second portion 22 is formed using the same general technique by which first portion 18 was formed, for example both by atomic layer deposition or both by chemical vapor deposition. Further preferably, first portion 18 and second portion 22 are formed in the same/common deposition chamber without removing the substrate from such chamber intermediate the formation of the first and second portions. In one preferred implementation, the second portion oxide material and the first portion oxide material are formed using at least the same pressure and same one or more precursors. In one preferred implementation, the second portion oxide material is formed using identical conditions (meaning at least the same pressure, precursors and flow rates) under which the first portion oxide material is formed, but for different temperature. Most preferably, first portion 18 restricts oxidation of the conductive metal first electrode layer during the formation of second portion 22. For example with respect aluminum oxide, the initial deposition of portion 18 at the lower temperature forms a less dense aluminum oxide than the aluminum oxide of portion 22 formed at the higher temperature, with portion 18 restricting oxidation of the underlying metal during formation of portion 22.

First and second portions 18, 22 might be formed to the same respective thickness, or to different thicknesses. Typically, and for example with respect to aluminum oxide, deposition of first portion 18 at temperatures below which significant oxidation would occur under typical deposition conditions and times results in a less than desired density layer (at least as initially deposited). Accordingly in one preferred embodiment, first portion 18 is formed to a thickness which is less than that of second portion 22, more preferably to a thickness which is no greater than one-third that of the second portion, and even more preferably to a thickness which is no greater than one-fifth that of the second portion.

Figure 4:
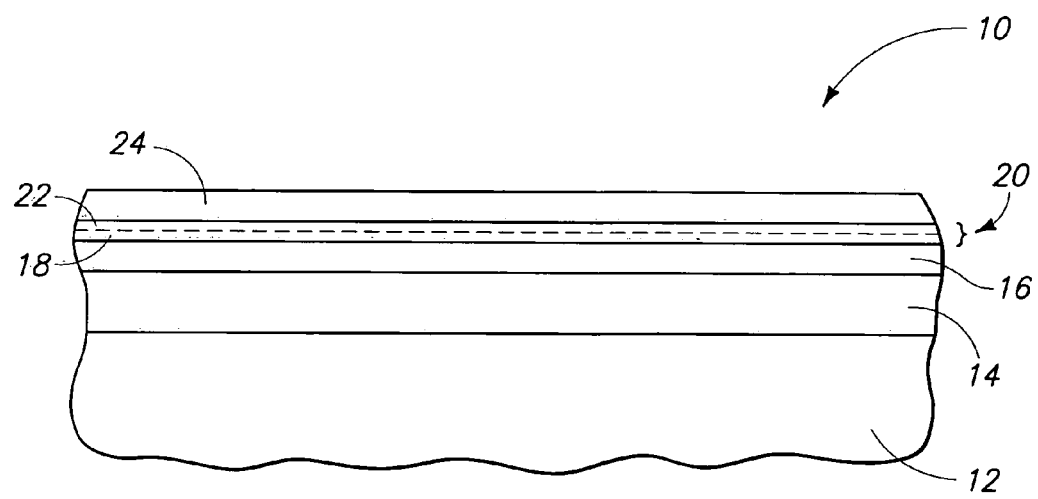
FIG. 4 is a view of the FIG. 3 wafer fragment at a processing step subsequent to that shown by FIG. 3.

Referring to FIG. 4, a conductive second electrode layer 24 has been formed over second portion oxide material 22, and preferably on such material as shown, of capacitor dielectric region 20. Preferred materials include conductive metal materials, for example the conductive metal nitrides referred to above. In one exemplary preferred embodiment, the entirety of the capacitor dielectric region 20 intermediate first electrode layer 14 and second electrode layer 24 consists essentially of aluminum oxide. Exemplary preferred thickness ranges for each of electrodes 16 and 24 include from 100 Angstroms to 200 Angstroms, with an exemplary thickness range for capacitor dielectric region 20 being from 40 Angstroms to 60 Angstroms.

By way of example only, exemplary capacitor dielectric materials include any one or combination of $HfO_2$, $Ta_2O_5$, $Y_2O_3$, $ZrO_2$, $HfSiO_4$, $ZrSiO_4$ and $YSiO_4$. Further, non-oxygen containing capacitor dielectric materials might be employed alternately or in addition to oxygen containing capacitor dielectric materials. Where an oxide is to be formed, exemplary oxidizers include $O_2$, $O_3$, $H_2O$, $NO_2$, NO and any alcohols (including polyols). Exemplary precursors include metallorganic precursors, for example tertbutylaluminum alkoxide, triethylaluminum, trimethylaluminum, tetrakis-dimethylamido hafnium, pentathoxy tantalum, n-butyl cyclopentadienyl yttrium, and other metal alkyls or metal alkoxides.

While the above described embodiment shows the layers as being blanketly deposited, any partial deposition technique (whether existing or yet-to-be developed) is also of course contemplated. Further, the respective illustrated layers can be patterned at any time into a desired shape of a capacitor if not deposited or otherwise initially formed in such shape.

Figure 5:
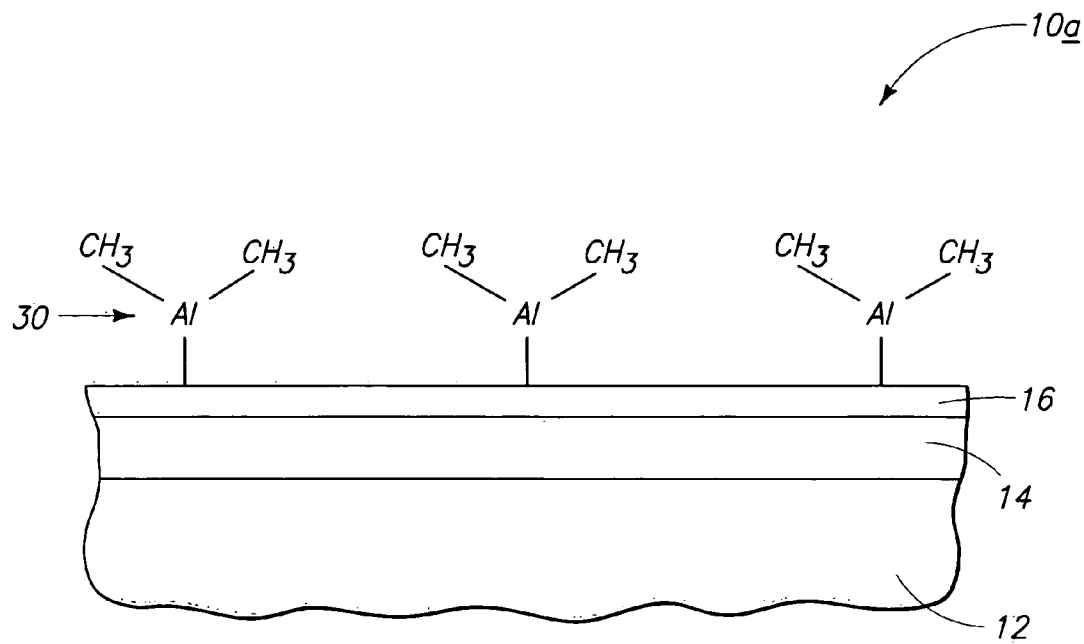
FIG. 5 is a diagrammatic sectional view of a semiconductor wafer fragment in process in accordance with an aspect of the invention.

By way of example only, an exemplary method of forming a capacitor using atomic layer deposition at least in part for the formation of a capacitor dielectric layer is described with reference to FIGS. 5-8 with respect to a substrate 10a. Like numerals from the first described embodiment have been utilized where appropriate, with differences being indicated with the suffix "a" or with different numerals. Referring to FIG. 5, a conductive metal first electrode layer 16 has been formed over a substrate, with the conductive metal being oxidizable to a higher degree at and above an oxidation temperature as compared to any degree of oxidation below the oxidation temperature. Exemplary preferred materials are as described above with respect to the FIGS. 1-4 embodiment. A metal containing first species is chemisorbed to form a first species monolayer 30 from a gaseous first precursor onto conductive metal first electrode layer 16. In the illustrated example, an exemplary gaseous first precursor is trimethylaluminum forming a metal containing first species in the form of $Al(CH_3)_x$.

Figure 6:
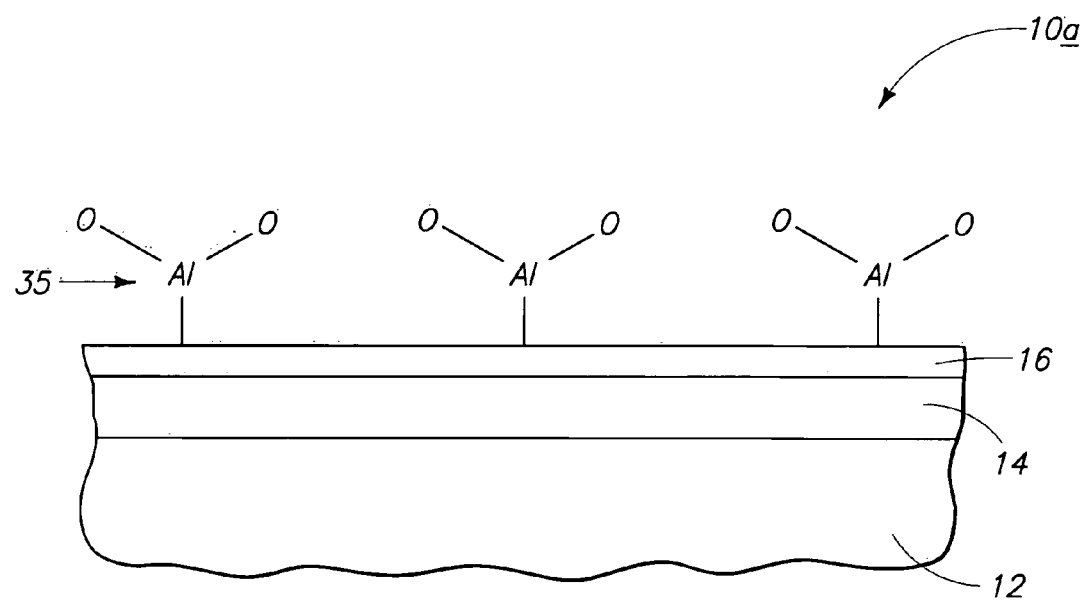
FIG. 6 is a view of the FIG. 5 wafer fragment at a processing step subsequent to that shown by FIG. 5.

Referring to FIG. 6, at a temperature below the selected oxidation temperature of at least the outermost portion of material 16, the chemisorbed first species has been contacted with an oxygen containing gaseous second precursor to react with the first species and form a dielectric oxide monolayer 35 which comprises the metal of the first species, namely the aluminum as shown in the illustrated example. Exemplary oxygen containing gaseous second precursors are any of those oxidizers identified above. Of course, monolayers 30 and 35 as described above might be discontinuously formed with respect to their respective underlying substrates. Such discontinuous or less than saturated monolayers are, however, considered a monolayer in the context of this document. Further, multiple of the above-described chemisorbings and contactings might be repeated once or multiple times prior to further processing. Further, the above-described chemisorbing and contacting might be conducted at a common temperature or at different temperatures, and even under other different conditions. Further, inert gas flow might be included with or intermediate the respective chemisorbing and contacting, or the deposition chamber pumped down without any inert gas feed towards purging the respective gaseous precursors from the chamber.

Figure 7:
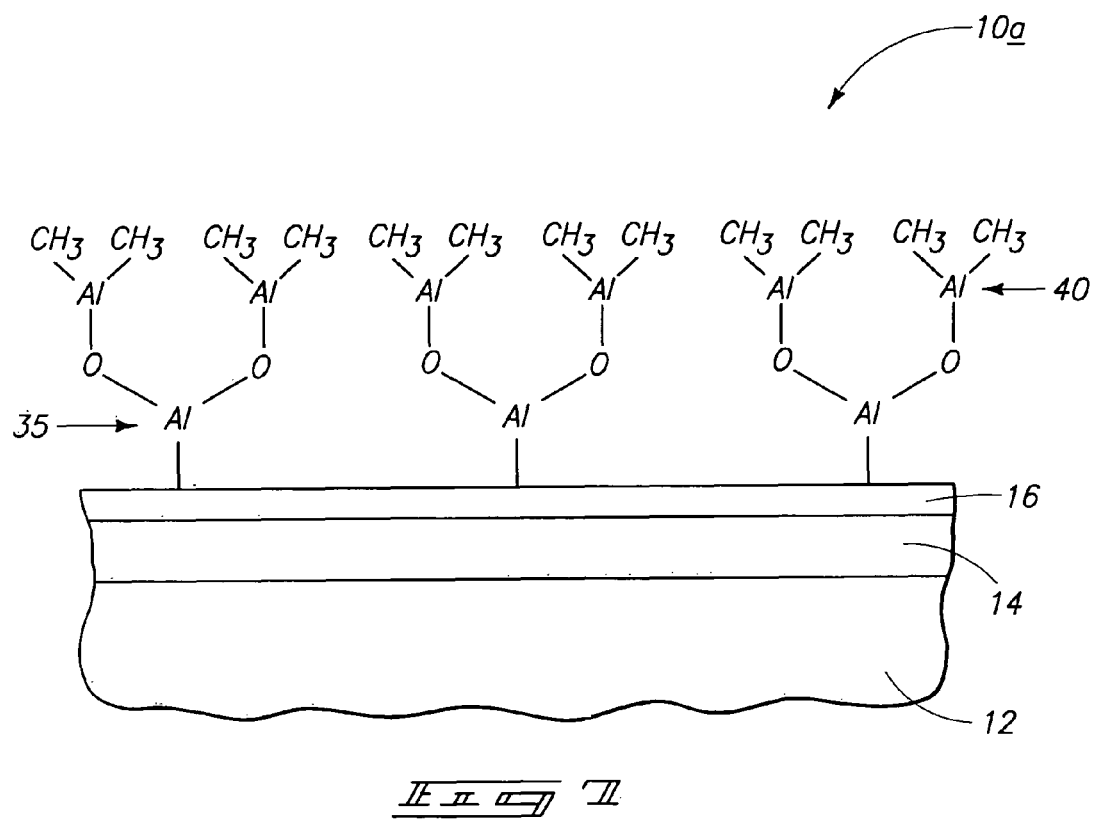
FIG. 7 is a view of the FIG. 6 wafer fragment at a processing step subsequent to that shown by FIG. 6.

Referring to FIG. 7, the metal containing first species is chemisorbed from the gaseous first precursor to form another first species monolayer 40 over the substrate which comprises the dielectric metal oxide.

Figure 8:
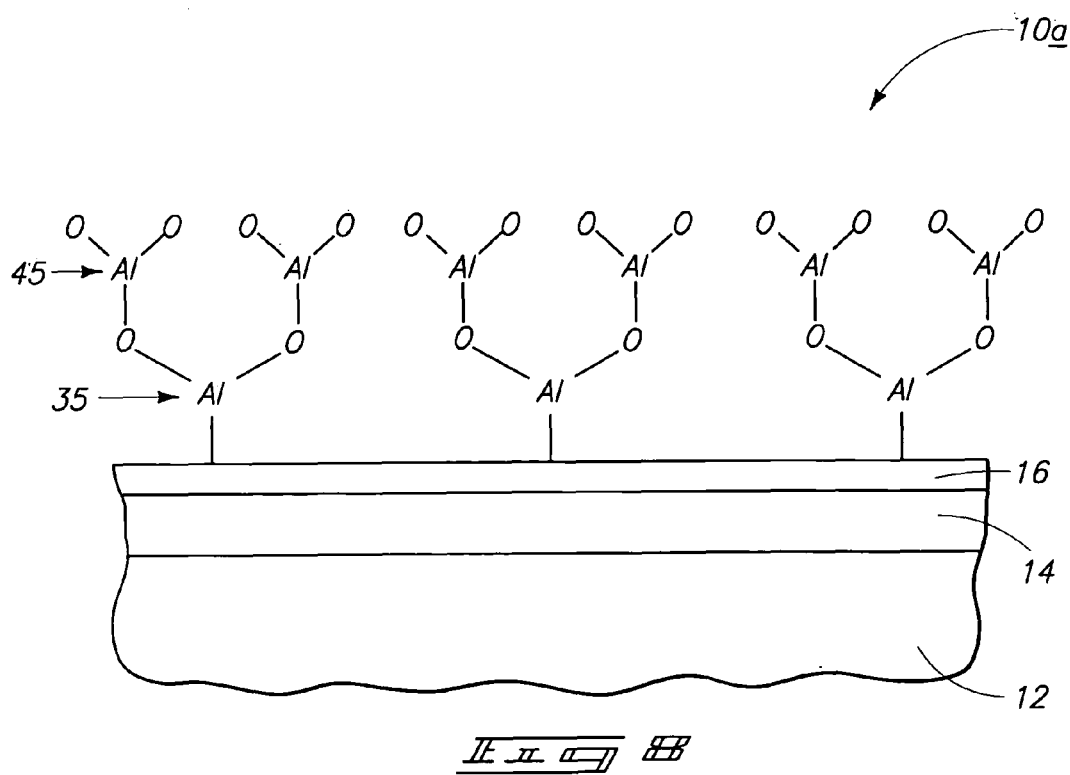
FIG. 8 is a view of the FIG. 7 wafer fragment at a processing step subsequent to that shown by FIG. 7.

Referring to FIG. 8, at a temperature above the oxidation temperature, the another first species monolayer 40 is contacted with an oxygen containing gaseous second precursor (i.e., the same or different as utilized above) to react with the first species and form another dielectric metal oxide monolayer 45 comprising the metal of the first species. During such formation, dielectric metal oxide monolayer 35 comprises a shield which, at least partially, restricts oxidation of conductive metal electrode layer 16 during such contacting of the another first species monolayer with the oxygen containing gaseous second precursor. As above, said monolayer 45 might be discontinuously formed/less than saturated such that the FIGS. 7 and 8 chemisorbing and contacting might be repeated at least once or multiple times more, prior to subsequent processing. Further as alluded to above, it might be desirable that the thickness of the sub-oxidation temperature material be greater than a saturated monolayer thick and, as well, be less than a total thickness of a second portion of the metal oxide layer being formed. Accordingly, the exemplary depicted chemisorbings and contactings exemplified by FIGS. 7 and 8 might be repeated more times than are the chemisorbings and contactings depicted by FIGS. 5 and 6, for example at least five times more, to achieve a corresponding thicker second portion as compared to the first portion. Also, the chemisorbing and contacting exemplified by the FIGS. 7 and 8 processings might be conducted at a common temperature or different temperatures.

A conductive second electrode layer would be formed over, and preferably on, the another dielectric metal oxide monolayer, typically as described above with respect with the first described embodiment.

By way of example only, for a material which has an oxidation temperature of around 300° C., the processing depicted by FIG. 6 would be conducted at a temperature no greater than 300° C., and the processing depicted by FIG. 8 would be conducted at a temperature of at least 325° C., and could of course be conducted at a higher temperature, for example of at least 425° C.

An exemplary preferred deposition range for the first portion formed with present generation processing is from about 5 Angstroms to about 20 Angstroms, with an exemplary thickness for the second portion being from about 10 Angstroms to about 40 Angstroms. An exemplary prior art atomic layer deposition method of forming an $Al_2O_3$ layer includes an aluminum precursor of trimethyl aluminum and an oxygen containing precursor of an $O_3$ and $O_2$ mixture containing from 5% to 20% by weight $O_3$. Prior art depositions have occurred at temperatures above 300° C., with 460° C. being a specific example. Pressure typically ranges from 200 mTorr to 5 Torr, with 1 Torr being a specific example. The typical thickness of the aluminum oxide formed for the capacitor dielectric layer is about 50 Angstroms, with metal electrode material therebeneath forming undesirable quantities of oxides of the metal of the underlying electrode material.

In a reduction-to-practice example in accordance with an aspect of the invention, a first portion of the oxide material, as described above, was formed in six complete ALD cycles using the above precursors at 250° C. and a pressure of 1 Torr. The substrate was received within a chamber having a volume of from about 1 liter to 2 liters, and the precursor pulses lasted from 1 to 2 seconds, respectively, with intervening inert argon purge pulsings. Such resulted in an average thickness of a first portion as described above which was substantially continuous/saturated at about from 4 Angstroms to 5 Angstroms, resulting in a probably discontinuous average deposition thickness of about 0.8 Angstroms per cycle. This was followed under otherwise identical conditions but at an increased temperature of 450° C. for about 50 complete deposition cycles, which resulted in a 40 Angstrom thick second portion at the higher deposition temperature, and without noticeable oxidation of the underlying metal nitride electrode material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A capacitor, comprising:
    a first capacitor electrode comprising conductive metal on a substrate, the first capacitor electrode having an outer surface without detectible oxidation;
    a second capacitor electrode spaced from the first capacitor electrode; and
    a capacitor dielectric region received between the first and second capacitor electrodes, said region comprising a first portion oxide material comprising aluminum oxide of a first density on the first capacitor electrode outer surface, said region comprising a second portion oxide material comprising aluminum oxide of a second density received over the first portion, the oxide-comprising material of the first portion and the oxide-comprising material of the second portion being the same in chemical composition and the second density being greater than the first density.

2. The capacitor of claim 1 wherein the second portion is received on the first portion.

3. The capacitor of claim 1 wherein the first portion has a thickness which is different from that of the second portion.

4. The capacitor of claim 1 wherein the first portion has a thickness which is the same as that of the second portion.

5. The capacitor of claim 1 wherein the first portion has a thickness which is less than that of the second portion.

6. The capacitor of claim 1 wherein the first portion has a thickness which is no greater than one-fifth that of the second portion.

7. The capacitor of claim 1 wherein the first portion has a thickness which is no greater than one-third that of the second portion.

8. The capacitor of claim 1 wherein the first portion has a thickness of from about 5 Angstroms to about 20 Angstroms.

9. The capacitor of claim 1 wherein the second portion has a thickness of from about 10 Angstroms to about 40 Angstroms.

10. The capacitor of claim 1 wherein the first portion has a thickness of from about 5 Angstroms to about 20 Angstroms, and the second portion has a thickness of from about 10 Angstroms to about 40 Angstroms and is of greater thickness than the first portion.

11. The capacitor of claim 1 wherein the capacitor dielectric region has a thickness from about 40 Angstroms to about 60 Angstroms.

12. The capacitor of claim 11 wherein the first portion has a thickness of from about 5 Angstroms to about 20 Angstroms.

13. The capacitor of claim 11 wherein the second portion has a thickness of from about 10 Angstroms to about 40 Angstroms.

14. The capacitor of claim 11 wherein the first portion has a thickness of from about 5 Angstroms to about 20 Angstroms, and the second portion has a thickness of from about 10 Angstroms to about 40 Angstroms and is of greater thickness than the first portion.

15. The capacitor of claim 1 wherein the oxide material consists essentially of aluminum oxide, and an entirety of the capacitor dielectric region intermediate the first and second capacitor electrodes layers consists essentially of aluminum oxide.

16. The capacitor of claim 1 wherein the first capacitor electrode comprises a conductive metal nitride.

17. The capacitor of claim 1 wherein the second portion is a monolayer in thickness.

18. The capacitor of claim 1 wherein the first portion is a monolayer in thickness.

19. The capacitor of claim 1 wherein the first portion is a monolayer in thickness, and the second portion is a monolayer in thickness.

20. The capacitor of claim 1 comprising a MIM capacitor.

21. A capacitor, comprising:
    a first capacitor electrode comprising conductive metal on a substrate;
    a second capacitor electrode spaced from the first capacitor electrode; and
    a capacitor dielectric region received between the first and second capacitor electrodes, said region comprising a first portion oxide material of a first density over the first capacitor electrode, said region comprising a second portion oxide material of a second density received over the first portion, the oxide-comprising material of the first portion and the oxide-comprising material of the second portion being the same in chemical composition and the second density being greater than the first density.

22. The capacitor of claim 21 wherein the oxide-comprising material comprises $HfO_2$.

23. The capacitor of claim 21 wherein the oxide-comprising material comprises $Ta_2O_5$.

24. The capacitor of claim 21 wherein the oxide-comprising material comprises $Y_2O_3$.

25. The capacitor of claim 21 wherein the oxide-comprising material comprises $ZrO_2$.

26. The capacitor of claim 21 wherein the oxide-comprising material comprises $HfSiO_4$.

27. The capacitor of claim 21 wherein the oxide-comprising material comprises $ZrSiO_4$.

28. The capacitor of claim 21 wherein the oxide-comprising material comprises $YSiO_4$.

29. The capacitor of claim 21 comprising a MIM capacitor.

* * * * *